(12) United States Patent
Xu

(10) Patent No.: US 12,224,763 B2
(45) Date of Patent: Feb. 11, 2025

(54) CALIBRATION METHOD OF CAPACITOR ARRAY TYPE SUCCESSIVE APPROXIMATION REGISTER ANALOG-TO-DIGITAL CONVERTER

(71) Applicant: Shen An Micro Co., Ltd., Hangzhou (CN)

(72) Inventor: Peng Xu, Hangzhou (CN)

(73) Assignee: Shen An Micro Co., Ltd., Hangzhou (CN)

( * ) Notice: Subject to any disclaimer, the term of this patent is extended or adjusted under 35 U.S.C. 154(b) by 192 days.

(21) Appl. No.: 18/075,213

(22) Filed: Dec. 5, 2022

(65) Prior Publication Data
US 2023/0198535 A1 Jun. 22, 2023

(30) Foreign Application Priority Data
Nov. 16, 2021 (CN) .......................... 202111352391.X (51) Int. Cl.
*H03M 1/10* (2006.01)

(52) U.S. Cl.
CPC ................................ *H03M 1/1014* (2013.01)

(58) Field of Classification Search
CPC .. H03M 1/1014; H03M 1/1033; H03M 1/804; H03M 1/468
See application file for complete search history.

(56) References Cited

U.S. PATENT DOCUMENTS 5,675,340 A * 10/1997 Hester ...................... H03M 1/06
341/172

6,587,066 B1 * 7/2003 Somayajula .......... H03M 1/0697
341/172

(Continued)

FOREIGN PATENT DOCUMENTS

| CN | 102163973 A | 8/2011 |
|----|-------------|--------|
| CN | 104168020 A | 11/2014 |

(Continued)

OTHER PUBLICATIONS

First Office Action, including search report, for Chinese Patent Application No. 202111352391.X, dated Dec. 24, 2021, 13 pages.

*Primary Examiner* — Lam T Mai
(74) *Attorney, Agent, or Firm* — Westman, Champlin & Koehler, P.A.

(57) ABSTRACT

Disclosed is a calibration method of a capacitor array type successive approximation register analog-to-digital converter, comprising: obtaining an actual weight value of capacitors of a target bit and an error code between the actual weight value and an ideal weight value of the capacitors of the target bit; calibrating an output code of the SAR ADC to be calibrated with the error code by corresponding addition or subtraction to obtain a final calibrated output code. The calibration method breaks through the requirement that non-binary weights must meet the redundancy, and can realize a weight calibration in a traditional binary ADC and a digital calibration by simple addition and subtraction on the basis of the original code obtained by an analog-to-digital conversion, thus effectively avoiding the error problem in the traditional technology, increasing the calibration precision and accuracy, reducing the circuit complexity and calculation complexity caused by the non-binary weights calibration.

9 Claims, 4 Drawing Sheets

S110: obtaining an actual weight value of capacitors of a target bit and an error code between the actual weight value and an ideal weight value of the capacitors of the target bit S120: calibrating an output code of the successive approximation register analog-to-digital converter to be calibrated with the error code by performing corresponding addition or subtraction to obtain a final calibrated output code (56) References Cited

U.S. PATENT DOCUMENTS

| | | | |
|---|---|---|---|
| 6,603,415 B1* | 8/2003 | Somayajula | H03M 1/0809 |
| | | | 341/172 |
| 8,508,400 B2* | 8/2013 | Wu | H03M 1/0673 |
| | | | 341/172 |
| 9,467,161 B1* | 10/2016 | Kim | H03M 1/145 |
| 9,531,400 B1* | 12/2016 | Wen | H03M 1/1009 |
| 9,559,716 B1* | 1/2017 | Matsui | H03M 1/1061 |
| 9,608,658 B1* | 3/2017 | Rajaee | H03M 1/1009 |
| 10,484,001 B1* | 11/2019 | Soundararajan | H03M 1/0641 |
| 10,574,250 B1* | 2/2020 | Braswell | H03M 1/1033 |
| 11,171,662 B1* | 11/2021 | Steensgaard-Madsen | |
| | | | H03M 1/069 |
| 11,283,459 B1* | 3/2022 | Monk | H03L 7/085 |
| 11,387,838 B1* | 7/2022 | Dyer | H03M 1/1033 |
| 11,677,409 B2* | 6/2023 | Dyer | H03M 1/1052 |
| | | | 341/120 |
| 2007/0132626 A1 | 6/2007 | Hurrell | |
| 2010/0090873 A1* | 4/2010 | Yang | H03M 1/1061 |
| | | | 341/126 |
| 2011/0122006 A1* | 5/2011 | Liao | H03M 1/1047 |
| | | | 341/120 |
| 2012/0075128 A1* | 3/2012 | Aruga | H03M 1/1019 |
| | | | 341/110 |
| 2014/0097975 A1* | 4/2014 | Hong | H03M 1/1071 |
| | | | 341/172 |
| 2015/0002321 A1* | 1/2015 | Zhou | H03M 1/0617 |
| | | | 341/118 |
| 2015/0180498 A1* | 6/2015 | Yang | H03M 1/403 |
| | | | 341/161 |
| 2015/0303933 A1* | 10/2015 | Giacomini | H03M 1/1245 |
| | | | 341/158 |
| 2016/0149583 A1* | 5/2016 | Burgio | H03M 1/802 |
| | | | 341/120 |
| 2018/0269893 A1* | 9/2018 | Chang | H03M 1/0682 |
| 2023/0117529 A1* | 4/2023 | Steensgaard-Madsen | |
| | | | H03M 1/164 |
| | | | 341/161 |

FOREIGN PATENT DOCUMENTS

| | | |
|---|---|---|
| CN | 105375925 A | 3/2016 |
| CN | 112202448 A | 1/2021 |
| CN | 112290945 A | 1/2021 |
| CN | 113037287 A | 6/2021 |
| CN | 113131933 A | 7/2021 |
| CN | 114553226 A | 5/2022 |

* cited by examiner

S110 — obtaining an actual weight value of capacitors of a target bit and an error code between the actual weight value and an ideal weight value of the capacitors of the target bit S120 — calibrating an output code of the successive approximation register analog-to-digital converter to be calibrated with the error code by performing corresponding addition or subtraction to obtain a final calibrated output code

CALIBRATION METHOD OF CAPACITOR ARRAY TYPE SUCCESSIVE APPROXIMATION REGISTER ANALOG-TO-DIGITAL CONVERTER

CROSS-REFERENCE TO RELATED APPLICATIONS

The present application claims the priority of Chinese Patent Application No. 202111352391.X, filed on Nov. 16, 2021 and entitled by "CALIBRATION METHOD OF CAPACITOR ARRAY TYPE SUCCESSIVE APPROXIMATION REGISTER ANALOG-TO-DIGITAL CONVERTER", which is incorporated herein by reference in its entirety.

FIELD OF TECHNOLOGY

The present disclosure relates to a technical field of electronic circuits, in particular to a calibration method of a capacitor array type successive approximation register analog-to-digital converter.

BACKGROUND

With the development of information industry, digital signal processing technology is changing with each passing day. As a bridge connecting analog and digital worlds, an analog-to-digital (A/D)/digital-to-analog (D/A) converter has also been widely used. For example, an analog-to-digital converter (ADC) bridging the analog and digital worlds, converts an analog signal into a digital signal. The improvement of digital signal processing speed inevitably requires high speed and high precision for the analog-to-digital/digital-to-analog converter, and the rapid development of portable consumer electronics, medical devices and so on, also puts forward a requirement of low power consumption for the analog-to-digital/digital-to-analog converter. The flash A/D and the $\Delta$-$\Sigma$A/D represent two categories focusing on high speed and high precision respectively. Compared with the two categories of the A/D, a capacitor array type successive approximation register analog-to-digital converter (SAR ADC) with medium speed and medium precision which is gradually favored by people because of its extremely low power consumption and low delay, is more and more widely used in the fields of medical instruments, industrial control, microcomputer interface and so on.

The SAR ADC determines a value of each bit by performing successive comparison between an input signal and a signal generated by an internal digital-to-analog converter (DAC). The DAC is usually realized by a capacitor array, of which the size is usually determined by resolution, linearity, and capacitor matching characteristics of the SAR ADC. First of all, compared with a resistance type or current type digital-to-analog converter, the capacitor array type ADC does not have static power consumption, and its energy consumption is mainly determined by capacitor charging and discharging processes. Secondly, the capacitor array itself has a sample-and-hold function, which can reduce the chip area and cost to a certain extent. However, no matter the capacitor array is a traditional binary capacitor array or a bridge capacitor array, the number of capacitors and chip area increase exponentially with the increase of resolution. If a unit capacitor C is selected according to resolution, linearity and production process matching degree of the SAR ADC, area of the capacitor array will increase, resulting in an increase in chip area, cost, power consumption and difficulty in improving a sampling rate. Moreover, when the capacitor matching degree cannot meet the linearity requirement of the SAR ADC, the direct current (DC) and alternating current (AC) performances of the SAR ADC, including differential nonlinearity (DNL), integral nonlinearity (INL), total harmonic distortion (THD), and spurious free dynamic range (SFDR), will be affected.

At present, the capacitor mismatch problem of the SAR ADC is usually solved by performing analog calibration or digital calibration. The analog calibration is performed by compensating an error caused by capacitor mismatch in a conversion process of each bit by adding a calibration circuit. The digital calibration is performed by storing the capacitor mismatch in a digital domain and calibrating it by post-processing after obtaining a conversion result. Compared with the digital calibration, the analog calibration has an advantage of low delay and disadvantages of increasing circuit complexity and area. The digital calibration could introduce redundancy using non-binary weights, so that a capacitor of a high bit can be calibrated with capacitors of lower bits. However, a non-binary weighted capacitor array increases the circuit complexity and calculation complexity.

SUMMARY

In order to solve the above technical problems, the present disclosure provides a calibration method of a capacitor array type successive approximation register analog-to-digital converter, which can break through the redundancy requirement necessary for a non-binary weighted analog-to-digital converter, and can realize weight calibration based on a traditional binary analog-to-digital converter, thus reducing circuit complexity and calculation complexity caused by non-binary weighting.

According to a first aspect of the present disclosure, a calibration method of a capacitor array type successive approximation register analog-to-digital converter is provided, capacitors of bits from low to high in the successive approximation register analog-to-digital converter are arranged with binary weight proportions, wherein the calibration method comprises:

obtaining an actual weight value of capacitors of a target bit and an error code between the actual weight value and an ideal weight value of the capacitors of the target bit;

calibrating an output code of the successive approximation register analog-to-digital converter to be calibrated with the error code by performing corresponding addition or subtraction to obtain a final calibrated output code.

In some embodiments, a capacitor array of the successive approximation register analog-to-digital converter comprises a positive capacitor array and a negative capacitor array, the step of obtaining the actual weight value of the capacitors of the target bit and the error code between the actual weight value and the ideal weight value of the capacitors of the target bit comprises:

initializing a positive capacitor of the target bit in the positive capacitor array and sampling;

switching plate voltage states of the capacitors of the target bit and capacitors of the lower bit next to the target bit through a logic control to obtain a first weight error voltage of the capacitors of the target bit;

converting the first weight error voltage using a differential analog-to-digital conversion to obtain a first weight error voltage code of the capacitors of the target bit, wherein the first weight error voltage code is represented by capacitors of bits from the bit next to the next lower bit of the target bit to the least significant bit;

initializing a negative capacitor of the target bit in the negative capacitor array and sampling;

switching plate voltage states of the capacitors of the target bit and capacitors of the lower bit next to the target bit through the logic control to obtain a second weight error voltage of the capacitors of the target bit;

converting the second weight error voltage using the differential analog-to-digital conversion to obtain a second weight error voltage code of the capacitors of the target bit, wherein the second weight error voltage code is represented by capacitors of the bits from the bit next to the next lower bit of the target bit to the least significant bit;

obtaining the error code between the actual weight value and the ideal weight value of the capacitors of the target bit according to the first weight error voltage code and the second weight error voltage code, wherein the capacitors of the target bit comprise the positive capacitor of the target bit and the negative capacitor of the target bit.

In some embodiments, each positive capacitor of any bit has a lower plate connected to any one of a positive input voltage, a positive reference voltage and a negative reference voltage through a three-selection switch, and an upper plate connected with a positive output end of the positive capacitor array at a connection node which is connected to a common voltage through a single-selection switch, and the step of initializing the positive capacitor of the target bit in the positive capacitor array and sampling comprises:

connecting a lower plate of the positive capacitor of the target bit in the positive capacitor array to the positive reference voltage, connecting lower plates of other positive capacitors in the positive capacitor array to the negative reference voltage, connecting a lower plate of a negative capacitor of the lower bit next to the target bit in the negative capacitor array to the positive reference voltage, connecting lower plates of other negative capacitors in the negative capacitor array to the negative reference voltage, and connecting an upper plate of each positive capacitor in the positive capacitor array to the common voltage through a single-selection switch, connecting an upper plate of each negative capacitor in the negative capacitor array to the common voltage through a single-selection switch;

disconnecting the common voltage from the upper plate of each positive capacitor and the upper plate of each negative capacitor and performing sampling, so as to keep capacitive charges of the positive capacitor array and the negative capacitor array constant.

In some embodiments, the step of switching the plate voltage states of the capacitors of the target bit and the capacitors of the lower bit next to the target bit through the logic control to obtain the first weight error voltage of the capacitors of the target bit comprises:

switching the plate voltage states of the positive capacitor of the target bit and a positive capacitor of the lower bit next to the target bit through the logic control, so as to switch the lower plate of the positive capacitor of the target bit in the positive capacitor array to be connected to the negative reference voltage, a lower plate of the positive capacitor of the lower bit next to the target bit to be connected to the positive reference voltage, and switching a lower plate of the negative capacitor of the lower bit next to the target bit in the negative capacitor array to be connected to the negative reference voltage, wherein the first weight error voltage is generated between the positive output end of the positive capacitor array and a negative output end of the negative capacitor array, wherein the first weight error voltage represents a difference between an actual weight value of the positive capacitor of the target bit and a sum of an actual weight value of the positive capacitor of the lower bit next to the target bit and an actual weight value of the negative capacitor of the lower bit next to the target bit.

In some embodiments, each negative capacitor of any bit has a lower plate connected to any one of a negative input voltage, the positive reference voltage and the negative reference voltage through a three-selection switch, and an upper plate connected with the negative output end of the negative capacitor array at a connection node which is connected to the common voltage through a single-selection switch, and the step of initializing the negative capacitor of the target bit in the negative capacitor array and sampling comprises:

connecting the lower plate of the positive capacitor of the lower bit next to the target bit in the positive capacitor array to the positive reference voltage, connecting lower plates of other positive capacitors in the positive capacitor array to the negative reference voltage, connecting the lower plate of the negative capacitor of the target bit in the negative capacitor array to the positive reference voltage, connecting lower plates of other negative capacitors in the negative capacitor array to the negative reference voltage, and connecting the upper plate of each positive capacitor in the positive capacitor array to the common voltage through a single-selection switch, connecting the upper plate of each negative capacitor in the negative capacitor array to the common voltage through a single-selection switch;

disconnecting the common voltage from the upper plate of each positive capacitor and the upper plate of each negative capacitor and performing sampling, so as to keep the capacitive charges of the positive capacitor array and the negative capacitor array constant.

In some embodiments, the step of switching the plate voltage states of the capacitors of the target bit and the capacitors of the lower bit next to the target bit through the logic control to obtain the second weight error voltage of the capacitors of the target bit comprises:

switching the plate voltage states of the positive capacitors of the target bit and the lower bit next to the target bit through the logic control, so as to switch the lower plate of the positive capacitor of the lower bit next to the target bit in the positive capacitor array to be connected to the negative reference voltage, and switching the lower plate of the negative capacitor of the lower bit next to the target bit in the negative capacitor array to be connected to the positive reference voltage, and the lower plate of the negative capacitor of the target bit to be connected to the negative reference voltage, wherein the second weight error voltage is generated between the positive output end of the positive capacitor array and the negative output end of the negative capacitor array, wherein the second weight error voltage represents a difference between an actual weight value of the negative capacitor of the target bit and the sum of the actual weight value of the positive capacitor of the lower bit next to the target bit and the actual weight value of the negative capacitor of the lower bit next to the target bit.

In some embodiments, the step of obtaining the actual weight value of capacitors of the target bit and the error code between the actual weight value and the ideal weight value of the capacitors of the target bit further comprises:

repeating an acquisition step to obtain a plurality of first weight error voltages, a plurality of first weight error voltage codes, a plurality of second weight error voltages and a plurality of second weight error voltage codes;

calculating an average value of the plurality of first weight error voltage codes and an average value of the plurality of second weight error voltage codes respectively; and obtaining the error code between the actual weight value and the ideal weight value of the capacitors of the target bit according to the average value of the plurality of first weight error voltage codes and the average value of the plurality of second weight error voltage codes;

or, repeating the acquisition step to obtain the plurality of first weight error voltage codes and the plurality of second weight error voltage codes;

calculating a plurality of error codes between the actual weight value and the ideal weight value of the capacitors of the target bit;

obtaining a final error code by calculating an average value of the plurality of error codes.

In some embodiments, the calibration method further comprises:

selecting an appropriate capacitor size to meet lower bits matching requirement according to capacitor production process, so that the weights of different starting high bits can be selected and calibrated accordingly.

In some embodiments, the calibration method further comprises:

adjusting a bit width of the output code obtained after each calibration according to a preset accuracy requirement and/or a parameter of a static memory, which is used to store the actual weight value or the error code.

According to a second aspect of the present disclosure, a calibration method of a capacitor array type successive approximation register analog-to-digital converter is provided, capacitors of bits from low to high in the successive approximation register analog-to-digital converter are arranged with binary weight proportions, wherein the calibration method comprises:

obtaining an actual weight value of capacitors of a target bit and a binary code of the actual weight value;

calibrating an output code of the successive approximation register analog-to-digital converter to be calibrated with the binary code by performing corresponding addition or subtraction to obtain a final calibrated output code.

A beneficial effect of the present disclosure is that the calibration method of the capacitor array type successive approximation register analog-to-digital converter provided by the present disclosure is applicable to a single-ended input analog-to-digital converter or an analog-to-digital converter with differential input ends, the capacitors of bits from low to high in the successive approximation register analog-to-digital converter are arranged with binary weight proportions, and the capacitor array is realized by a traditional binary capacitor array or bridge capacitor array, weight of each bit is realized by a single capacitor or a pair of equivalent capacitors, so that the weight deviation caused by capacitor mismatch or parasitic capacitor can be calibrated. In the calibration method, an actual weight value of capacitors of a target bit and an error code between the actual weight value and an ideal weight value of the capacitors of the target bit are obtained, then an output code to be calibrated of the successive approximation register analog-to-digital converter is calibrated with the error code by performing corresponding addition or subtraction to obtain a final calibrated output code. The calibration method breaks through the requirement that non-binary weights must meet the redundancy, and can realize a weight calibration in a traditional binary analog-to-digital converter and a digital calibration by performing simple addition and subtraction on the basis of the original code obtained by performing an analog-to-digital conversion, thus effectively avoiding the problem that in the traditional binary weight calibration, the existence of comparator voltage offset makes the DNL drifting in a certain direction and several calibration bits of the LSB insufficient to represent the error value including the voltage offset, increasing the calibration precision and accuracy, and reducing the circuit complexity and calculation complexity caused by the non-binary weights calibration.

BRIEF DESCRIPTION OF THE DRAWINGS

The above and other purposes, features and advantages of the present disclosure will become more apparent through the following description of the embodiments of the present disclosure with reference to the accompanying drawings. Wherein.

DESCRIPTION OF THE EMBODIMENTS

The present disclosure will be described more comprehensively below with reference to the relevant accompanying drawings to conveniently understand the present disclosure. Preferred embodiments of the present disclosure are shown in the accompanying drawings. However, the present disclosure can be implemented in different forms and is not limited to the embodiments described herein. On the contrary, these embodiments is provided to make a more thorough and comprehensive understanding of the present disclosure.

All technical and scientific terms used herein have the same meanings as those commonly understood by those skilled in the technical field of the present disclosure, unless otherwise defined. The terms used in the specification are only for the purpose of describing specific embodiments, and not intended to limit the present disclosure.

The present disclosure will be described below in detail with reference to the accompanying drawings.

A simplest traditional binary capacitor array is composed of C, C, 2C, 4C, ..., $2^{n-1}$C, which correspond to the weights of different binary bits, wherein n is the resolution of an ADC, C is a unit capacitor, and the total capacitors are $2^n$ C. The total number of the capacitors in a bridge capacitor array can be reduced by introducing a bridge capacitor in the bridge capacitor array. The aforementioned capacitor array is divided into two arrays connected by a bridge capacitor Cc in between, of which the total capacitors are about $2^{n/2+1}$C, and each array is composed of C, 2C, . . . , $2^{n/2-1}$C. The aforementioned capacitor array can also be divided into smaller capacitor arrays to further reduce the total number of the capacitors.

Figure 1:
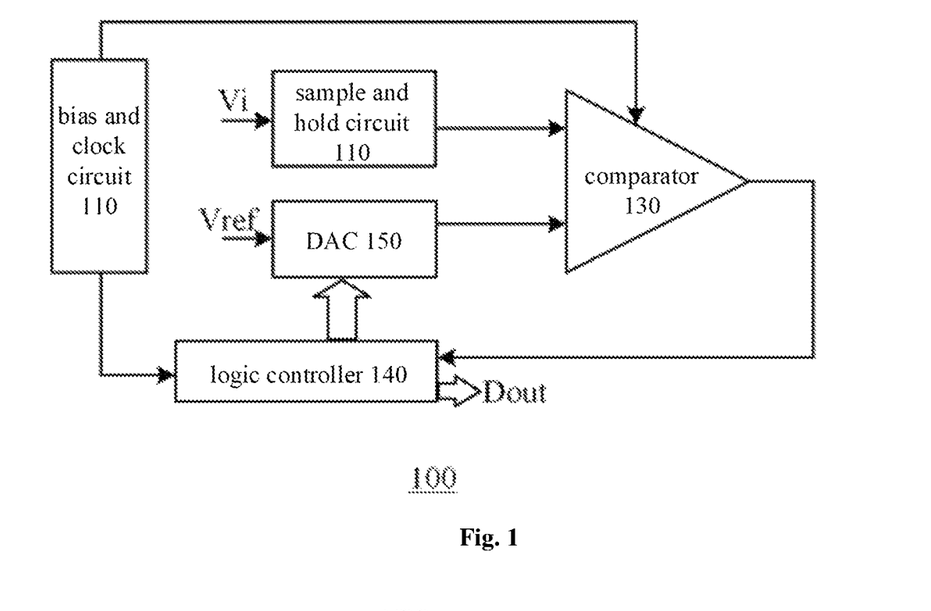
FIG. 1 shows a system block diagram of a successive approximation register analog-to-digital converter according to the prior art.

FIG. 1 shows a system block diagram of a successive approximation register analog-to-digital converter according to the prior art. Referring to FIG. 1, the traditional successive approximation register analog-to-digital converter (SAR ADC) 100 usually comprises a bias and clock circuit 110, a sample and hold circuit 120, a comparator 130, a logic controller 140, and a digital-to-analog converter (DAC) 150, wherein Vi is an input signal, Vref is a reference signal, and Dout is an output code of the SAR ADC. An output of the sample and hold circuit 120 and an output of the DAC 150 are used as inputs of the comparator 130, which generates a comparison result according to the magnitude of its input voltages at both ends and takes the comparison result as an input of the logic controller 140. Based on this, the logic controller 140 generates a control signal of the DAC 150 and a final output code. The bias and clock circuit 110 is responsible for providing clocks, voltages and current biases for various modules of the chip. The working process of the SAR ADC is simply summarized as follows: first, comparing Vi with ½ Vref to obtain a comparison result, then comparing Vi with ¾ Vref or ¼ Vref according to that comparison result, and so on for successive approximation, n times comparison processes are performed and an n-bit output can be obtained.

Figure 2:
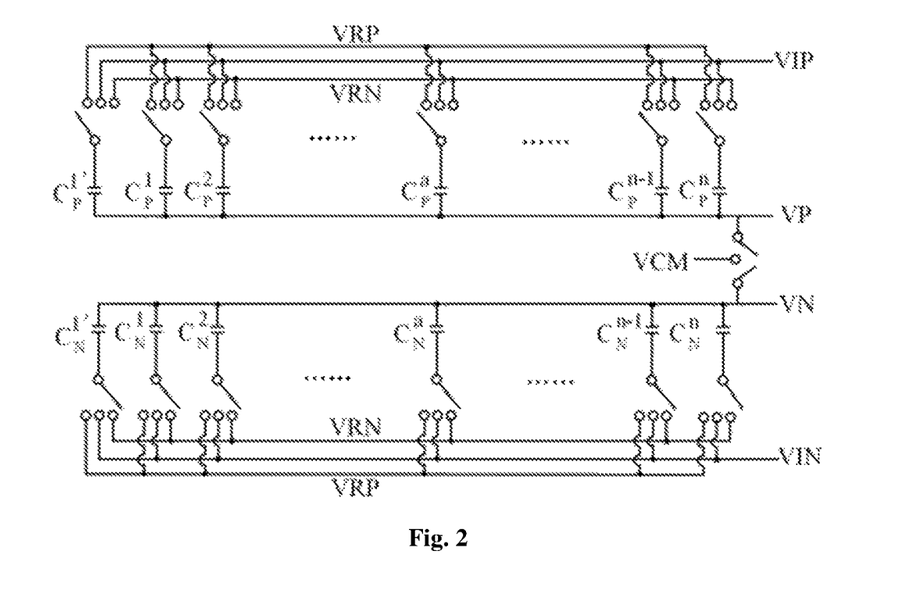
FIG. 2 shows a structural schematic view of a capacitor array in a differential binary weighted capacitor array type digital-to-analog converter according to the prior art.

The SAR ADC can be divided into many types according to the difference of the embedded DAC, among which the capacitor array type DAC is widely used. As shown in FIG. 2, it is arranged that VRP is a positive reference voltage, VRN is a negative reference voltage, VCM is a common mode voltage, VIP is a positive input voltage, and VIN is a negative input voltage. The capacitor array is divided into a P-end capacitor array and an N-end capacitor array. There are (n+1) capacitors comprising $C_P^{1'}$, $C_P^1$, . . . , $C_P^n$ in the P-end capacitor array, wherein a lower plate of each capacitor is connected to any one of the positive reference voltage VRP, the negative reference voltage VRN and the positive input voltage VIP through a three-selection switch controlled by the logic controller 140, and upper plates of all the (n+1) capacitors are connected together and are configured to provide an output voltage VP. There are (n+1) capacitors comprising $C_P^{1'}$, $C_P^1$, . . . , $C_P^n$ in the N-end capacitor array, wherein a lower plate of each capacitor is connected to any one of the positive reference voltage VRP, the negative reference voltage VRN and the negative input voltage VIN through a three-selection switch controlled by the logic controller 140, and upper plates of all the (n+1) capacitors are connected together and are configured to provide an output voltage VN. The output voltage VP and the output voltage VN are respectively connected to a positive input terminal and a negative input terminal of a next stage comparator. As mentioned above, the digital-to-analog converter based on the binary capacitor array has the following advantages: the capacitor array itself has a sample-and-hold function; compared with a resistance type or current type digital-to-analog converter, the capacitor array type digital-to-analog converter does not have static power consumption, and its energy consumption is mainly determined by capacitor charging and discharging processes.

However, the capacitor array has two shortcomings for the SAR ADC at present: 1) the capacitor array is usually in the form of binary weight, so that the total number of the capacitors increases as a power function with the conversion accuracy; 2) capacitor matching accuracy is limited. In FIG. 2, it is arranged that c0 is a unit capacitance, $\varepsilon_P^i$ is a mismatch coefficient of a capacitor of the $i^{th}$ bit in the P-end array, $\varepsilon_N^i$ is a mismatch coefficient of a capacitor of the $i^{th}$ bit in the N-end array, $\varepsilon_P^{i'}$ and $\varepsilon_N^{i'}$ are also mismatch coefficients. After considering the capacitor mismatch, the actual capacitance value of each capacitor shown in FIG. 2 can be expressed as $$C_P^{1'} = c0*(1+\varepsilon_P^{1'}) \quad C_N^{1'} = c0*(1+\varepsilon_N^{1'})$$
$$C_P^i = 2^{i-1}*c0*(1+\varepsilon_P^i) \text{ and } C_N^i = 2^{i-1}*c0*(1+\varepsilon_N^i).$$

Figure 3:
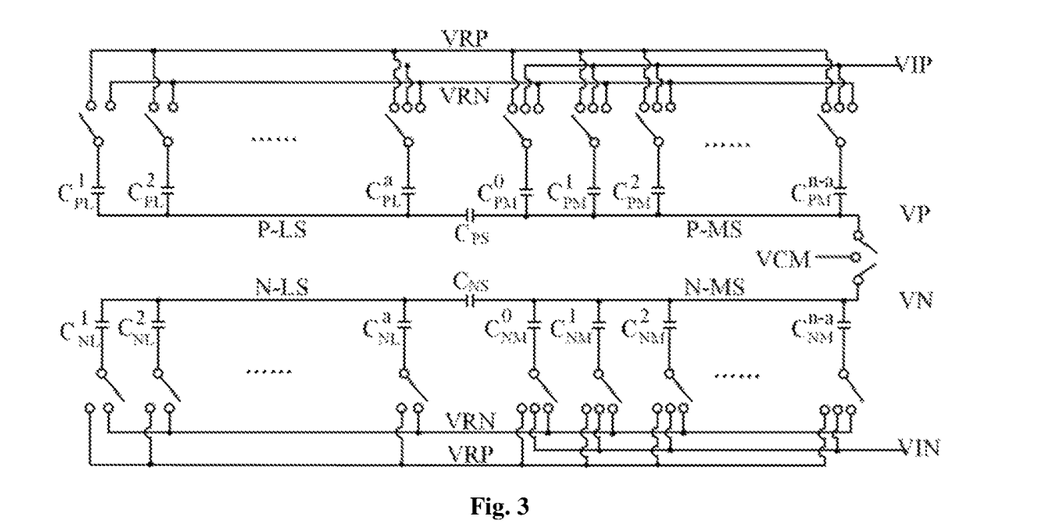
FIG. 3 shows a structural schematic view of a capacitor array in a segmented binary weighted capacitor array type digital-to-analog converter according to the prior art.

For the first problem, the current mainstream improvement solution is design the capacitor array with segmental capacitor structure. As shown in FIG. 3, meanings of VP, VN, VRP, VRN, VIP, VIN and c0 are consistent with those in FIG. 2, and the capacitor array is also divided into a P-end capacitor array and an N-end capacitor array. It is arranged that the near end of the output voltage VP refers to as P-MS end, and the far end of the output voltage VP refers to as P-LS end, and the P-MS end and the P-LS end are connected through a bridge capacitor $C_{PS}$, $\varepsilon_{PM}^i$ is a mismatch coefficient of a capacitor of the $i^{th}$ bit in the P-end capacitor array at the P-MS end, $\varepsilon_{PL}^i$ is a mismatch coefficient of a capacitor of the $i^{th}$ bit in the P-end capacitor array at the P-LS end, $\varepsilon_{PS}$ is a mismatch coefficient between the bridge capacitor $C_{PS}$ and the unit capacitor. It is also arranged that the near end of the output voltage VN refers to as N-MS end, and the far end of the output voltage VN refers to as N-LS end, and the N-MS end and the N-LS end are connected through a bridge capacitor $C_{NS}$, $\varepsilon_{NM}^i$ is a mismatch coefficient of a capacitor of the $i^{th}$ bit in the N-end capacitor array at the N-MS end, $\varepsilon_{NL}^i$ is a mismatch coefficient of a capacitor of the $i^{th}$ bit in the N-end capacitor array at the N-LS end, $\varepsilon_{NS}$ is a mismatch coefficient between the bridge capacitor $C_{NS}$ and the unit capacitor. After considering the capacitor mismatch, the actual capacitance value of each capacitor shown in FIG. 3 can be expressed as:

$$C_{PM}^0 = c0*(1+\varepsilon_{PM}^0) \quad C_{NM}^0 = c0*(1+\varepsilon_{NM}^0)$$
$$C_{PM}^i = 2^{i-1}*c0*(1+\varepsilon_{PM}^i) \quad C_{NM}^i = 2^{i-1}*c0*(1+\varepsilon_{NM}^i)$$
$$C_{PS} = c0*(1+\varepsilon_{PS}) \text{ and } C_{NS} = c0*(1+\varepsilon_{NS}).$$
$$C_{PL}^i = 2^{i-1}*c0*(1+\varepsilon_{PL}^i) \quad C_{NL}^i = 2^{i-1}*c0*(1+\varepsilon_{NL}^i)$$

The structure shown in FIG. 3 can reduce the total number of capacitors by several times, but each segment is still in the form of binary weight, and the influence of the capacitor mismatch still exists naturally. For the second problem, many solutions have been proposed by predecessors in terms of layout and calibration, such as adding virtual redundant capacitors on the layout, and using a common center structure, which can overcome the inherent errors caused by uneven thickness of dielectric plates due to process production conditions to a certain extent, but can also bring about two problems: 1) the wires are complex and parasitism is serious; 2) the number of the virtual redundant capacitors is considerable, and the area efficiency is greatly reduced.

In order to compensating the errors caused by capacitor matching problems, in addition to the above layout level methods, there are various calibration methods, such as a calibration method for a capacitor array in a capacitor type successive approximation register analog-to-digital converter, which is most similar to the present disclosure. The article "A 12b 70 MS/s SAR ADC with Digital Startup Calibration in 14 nm CMOS", proposed by Chun C. Lee and others at the VLSI circuit seminar in 2015, has pointed out that the differential nonlinear (DNL) errors are accumulated to the end for a digital calibration, using the conversion difference between codewords of 011111 and 100000 (caused by the error of the most significant bit (MSB)) and the conversion difference between codewords of x01111 and x10000 (caused by the error of (MSB-1) bit). The calibration process is as follows: firstly, before the normal conversion, starting the calibration process from a least significant bit to be calibrated, forcing the bit to be calibrated to be 0 and 1 by ignoring the bits higher than the bit being calibrated, and then converting and comparing other bits in a normal way to get a D+ and a D−, so as to obtain the calibration information of the bit to be calibrated through dividing the difference between the D+ and the D− by 2; secondly, calibrating the first bit to be calibrated to the most significant bit, respectively, until the calibration to the most significant bit contains the error information of the lower bit(s), and using a register to record the final calibration information of the MSB, so that after all calibrations are completed, at the end of each normal conversion, this calibration information is added with an adder, then the final result is obtained through redundancy conversion, so as to achieve the calibration purpose. This method relies on the redundancy of sub-binary weight, and has some shortcomings: the existence of comparator voltage offset makes the DNL drifting in a certain direction, which makes several calibration bits of the LSB insufficient to represent the error value including the voltage offset, so more redundancy needs to be added to reduce the impact of the comparator voltage offset.

To avoid the redundancy requirement necessary for the non-binary weighted analog-to-digital converter which increase the circuit complexity and calculation complexity, and to correct the errors in the weights based on the binary capacitor array, the present disclosure provides a calibration method for a capacitor array type successive approximation register analog-to-digital converter, which is applicable to a single-ended input analog-to-digital converter or an analog-to-digital converter with differential input ends. The weight deviation caused by capacitor mismatch or parasitic capacitor can be calibrated by a traditional binary capacitor array or bridge capacitor array, as well as the weight architecture of each bit achieved through a single capacitor or a pair of equivalent capacitors.

The calibration method provided by the present disclosure breaks through a requirement that non-binary weights must meet the redundancy, and can realize a weight calibration in a traditional binary analog-to-digital converter and a digital calibration by performing simple addition and subtraction on the basis of the original code obtained by performing an analog-to-digital conversion, thus reducing the circuit complexity and calculation complexity caused by non-binary weighting.

Figure 4:
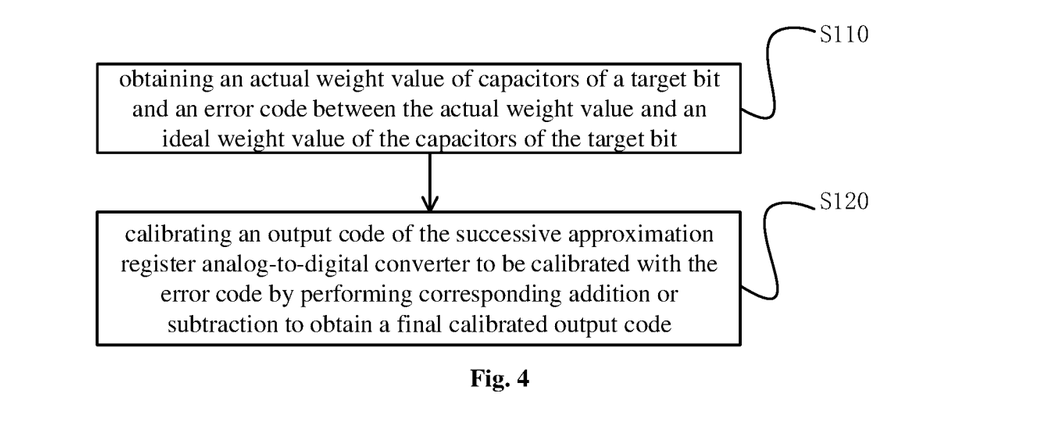
FIG. 4 shows a flowchart of a calibration method of a capacitor array type successive approximation register analog-to-digital converter according to an embodiment of the present disclosure.
Figure 5:
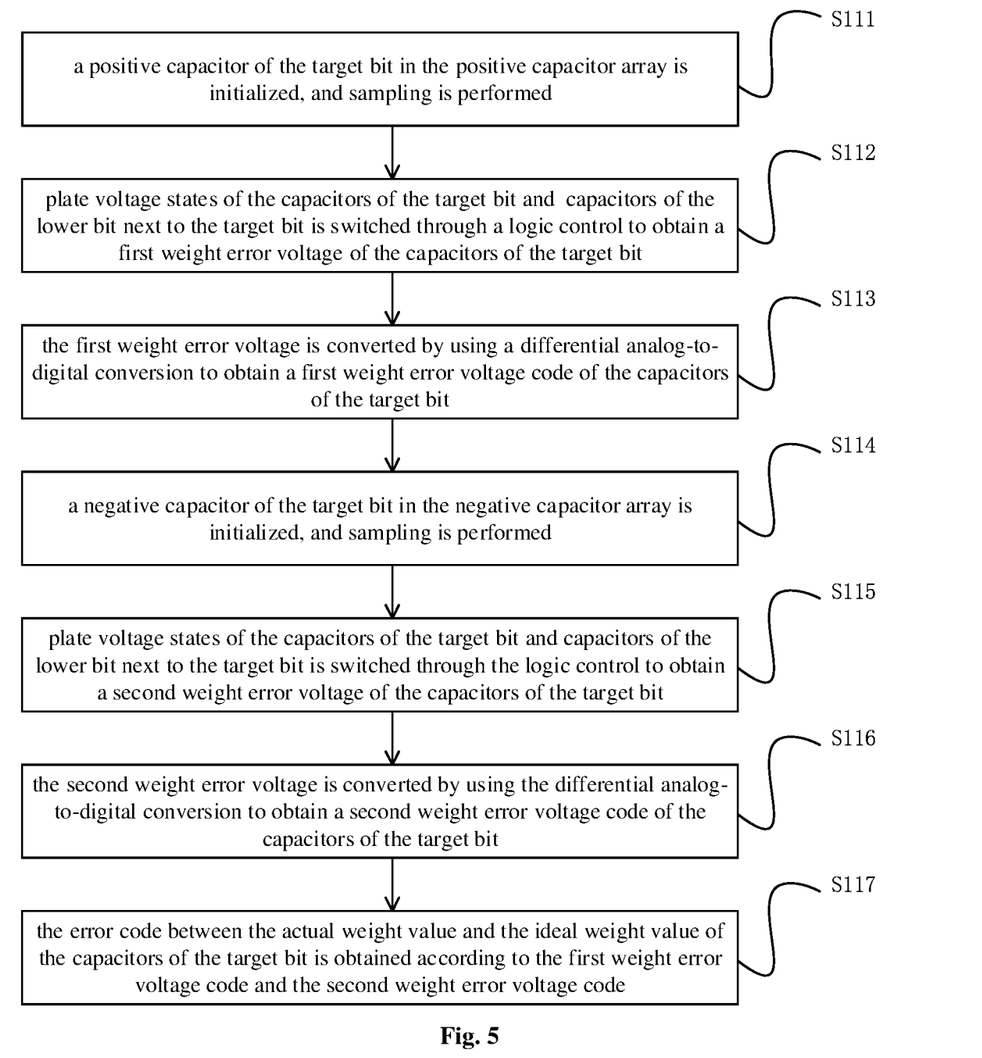
FIG. 5 shows a flowchart of the sub-steps of the step S110 in the calibration method shown in FIG. 4.
Figure 6:
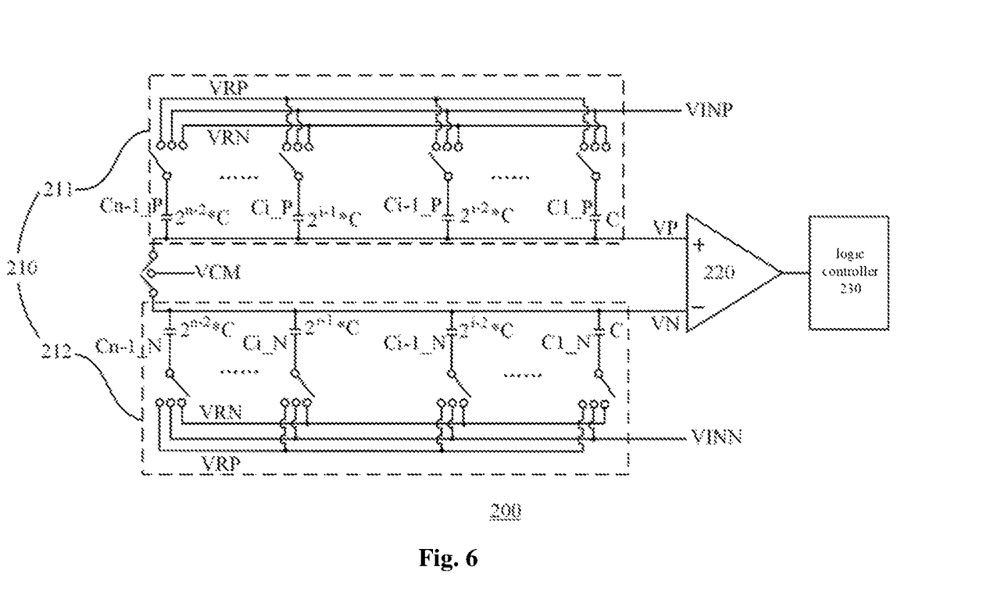
FIG. 6 shows a partial structure schematic view of a binary n-bit SAR ADC with differential input according to an embodiment of the present disclosure.

FIG. 4 shows a flowchart of a calibration method of a capacitor array type successive approximation register analog-to-digital converter according to an embodiment of the present disclosure, FIG. 5 shows a flowchart of the sub-steps of the step S110 in the calibration method shown in FIG. 4, FIG. 6 shows a partial structure schematic view of a binary n-bit SAR ADC with differential input according to an embodiment of the present disclosure.

The calibration method of the capacitor array type successive approximation register analog-to-digital converter provided by the embodiments of the present disclosure is suitable for a single-ended input analog-to-digital converter or an analog-to-digital converter with differential input, and the capacitors of bits from low to high in the successive approximation register analog-to-digital converter are arranged with binary weight proportions. In the embodiment, the aforementioned successive approximation register analog-to-digital converter takes an analog-to-digital converter 200 with differential input as an example, as shown in FIG. 6. The analog-to-digital converter 200 with differential input is a binary n-bit SAR ADC with differential input, and at least includes a capacitor array 210, a comparator 220 and a logic controller 230. The capacitor array 210 includes a positive capacitor array 211 and a negative capacitor array 212. Each positive capacitor Ci_P of any bit has a lower plate connected to any one of a positive input voltage VINP, a positive reference voltage VRP and a negative reference voltage VRN through a three-selection switch, and an upper plate connected with a positive output end VP of the positive capacitor array 211 at a connection node, which is connected to a common voltage VCM through a single-selection switch. Each negative capacitor Ci_N of any bit has a lower plate connected to any one of a negative input voltage VINN, the positive reference voltage VRP and the negative reference voltage VRN through a three-selection switch, and an upper plate connected with a negative output end VN of the negative capacitor array 212 at a connection node, which is connected to the common voltage VCM through a single-selection switch. The positive output end VP of the positive capacitor array 211 is connected to a non-inverting input terminal of the comparator 220, and the negative output end VN of the negative capacitor array 212 is connected to an inverting input terminal of the comparator 220. The comparator 220 is configured to generate a comparison result (represented by a high or low logic level) according to the voltage magnitude relationship between the positive output end VP and the negative output end VN. The comparison result is fed back to the switches of the positive capacitor array 211 and the negative capacitor array 212 by the logic controller 230. On the one hand, the logic controller 230 is used to control the switching between a calibration state (for measuring the capacitance, calculating and storing the weight) and a normal analog-to-digital conversion state of the analog-to-digital converter 200 with differential input; on the other hand, the logic controller 230 is used to provide timing control signals for various switches (for example, three-selection switches, single-selection switches) in the capacitor array 210, the connection selection of which is determined by the logic controller 230 according to the input and the current working mode of the comparator 220. Referring to FIG. 4, the calibration method comprising:

Step 110: obtaining an actual weight value of capacitors of a target bit and an error code between the actual weight value and an ideal weight value of the capacitors of the target bit.

Step 120: calibrating an output code of the successive approximation register analog-to-digital converter to be calibrated with the error code by performing corresponding addition or subtraction to obtain a final calibrated output code.

Referring to FIG. 4 to FIG. 6, n−1 pairs of capacitors are arranged between the positive output end VP and the negative output end VN of the capacitor array 210, which correspond to the weights of the binary bits respectively, and the binary least significant bit (LSB) has no corresponding actual capacitor, which can be regarded as a virtual capacitor. The capacitors of the bits from low to high in the positive capacitance array 211 or the negative capacitance array 212 follow binary weight proportions, that is, the capacitance value of a capacitor of the $i^{th}$ bit is twice than that of a capacitor of the $(i-1)^{th}$ bit. Ideally, the weight corresponding to the capacitor of each bit corresponds to the value of each binary bit, for example, the weight w, of the capacitor of the $i^{th}$ bit is $2^{i-1}$.

Due to the capacitor mismatch, there is an error e between the weight of the capacitor of each binary bit and the ideal weight value, wherein, $$e_i = \omega_i - \omega_{i,ideal}$$
$$\omega_{i,ideal} = 2^i$$

$\omega_i$ and $\omega_{i,ideal}$ are the actual weight value and the ideal weight value of the capacitor of the $i^{th}$ bit, where i=0, 1, 2, ..., n-1.

In step S110, referring to FIG. 5, the foresaid obtaining an actual weight value w, of capacitors of a target bit (for example, the $i^{th}$ bit) and an error code between the actual weight value $\omega_i$ and an ideal weight value $\omega_{i,ideal}$ of the capacitors of the target bit can specifically include the following sub-steps S111 to S117.

In sub-step S111: a positive capacitor of the target bit in the positive capacitor array is initialized, and sampling is performed.

In sub-step S111, the aforementioned capacitors of the target bit include a positive capacitor of the target bit and a negative capacitor of the target bit. A lower plate of a positive capacitor Ci_p of the target bit (the $i^{th}$ bit) in the positive capacitor array 211 is connected to a positive reference voltage VRP. Lower plates of other positive capacitors in the positive capacitor array 211 are connected to a negative reference voltage VRN. A lower plate of a negative capacitor Ci-1_n of the lower bit next to the target bit (the (i-1)th bit) in the negative capacitor array 212 is connected to the positive reference voltage VRP. Lower plates of other negative capacitors in the negative capacitor array 212 are connected to the negative reference voltage VRN. An upper plate of each positive capacitor in the positive capacitor array 211 is connected to a common voltage VCM through a single-selection switch, and an upper plate of each negative capacitor in the negative capacitor array 212 is connected to the common voltage VCM through a single-selection switch. That is, the positive output end VP, the negative output end VN and the common voltage VCM are equal (VP=VN=VCM).

Then, the aforementioned common voltage VCM is disconnected, and sampling is performed, so that the capacitive charges of the positive capacitor array 211 and the negative capacitor array 212 are kept constant.

With reference to FIG. 6, it is assumed that k is an arbitrary integer from n-1 to i+1 and from i-2 to 1, and the initialization process comprises:

Vk_p=VRN, Vk_n=VRN, Vi_p=VRP, Vi_n=VRN, Vi-1_p=VRN, Vi-1_n=VRP, VP=VN=VCM, wherein, Vk_p is the three-selection switch connected to the lower plate of the positive capacitor of the $k^{th}$ bit, Vk_n is the three-selection switch connected to the lower plate of the negative capacitor of the $k^{th}$ bit, Vi_p is the lower plate voltage of the positive capacitor of the $i^{th}$ bit, Vi_n is the lower plate voltage of the negative capacitor of the $i^{th}$ bit. Similarly, Vi-1_p and Vi-1_n are the lower plate voltages of the positive capacitor and the negative capacitor of the $(i-1)^{th}$ bit respectively. After initializing the capacitors and the switches, the common voltage is disconnected, and then sampling can be performed.

In sub-step S112: plate voltage states of the capacitors of the target bit and capacitors of the lower bit next to the target bit is switched through a logic control to obtain a first weight error voltage of the capacitors of the target bit.

In sub-step S112, the logic control switches the plate voltage states of the positive capacitors of the target bit (the $i^{th}$ bit) and the lower bit next to the target bit (the $(i-1)^{th}$ bit), so that the lower plate of the positive capacitor of the target bit (the $i^{th}$ bit) in the positive capacitor array 211 is switched to be connected to the negative reference voltage VRN, the lower plate of the positive capacitor of the lower bit next to the target bit (the $(i-1)^{th}$ bit) is switched to be connected to the positive reference voltage VRP, the lower plate of the negative capacitor of the lower bit next to the target bit (the $(i-1)^{th}$ bit) in the negative capacitor array 212 is switched to be connected to the negative reference voltage VRN, and the first weight error voltage VP–VN is generated between the positive output end VP of the positive capacitor array 211 and the negative output end VN of the negative capacitor array 212. Wherein, the first weight error voltage VP–VN represents the difference between the actual weight value $\omega_{i,0}$ of the positive capacitor Ci_p of the target bit (the $i^{th}$ positive capacitor, which is named in a similar way below, and will not be described too much) and the sum $\omega_{i-1}$ of the actual weight value of the positive capacitor Ci-1_p of the lower bit next to the target bit and the actual weight value of the negative capacitor Ci-1_n of the lower bit next to the target bit.

$$VP-VN=(VRP-VRN)*(\omega_{i-1}-\omega_{i,0})/\omega_{total} \quad (1)$$

In the embodiment, in combination with FIG. 6, specifically, switch connection states are switched through the logic control making Vi_p=VRN, Vi_n=VRN, Vi-1_p=VRP, Vi-1_n=VRN, so that the first weight error voltage VP–VN is generated between the positive output end VP of the positive capacitor array 211 and the negative output end VN of the negative capacitor array 212.

In the case of ideal matching, Ci_p=Ci_n=2*Ci-1_p=2*Ci-1_n, $\omega_{i,0}-\omega_{i-1}=0$, that is, the voltage value of the first weight error voltage VP–VN is zero. However, due to capacitor mismatch, the first weight error voltage VP–VN can be positive or negative.

In sub-step S113: the first weight error voltage is converted by using a differential analog-to-digital conversion to obtain a first weight error voltage code of the capacitors of the target bit.

In sub-step S113, the first weight error voltage code is represented by the capacitors of the bits from the bit (the $(i-2)^{th}$ bit) after a next lower bit of the target bit to the least significant bit. Specifically, the i-1 bit code $b_{i-2}b_{i-1} \ldots b_0$ of the first weight error voltage is obtained by converting the first weight error voltage with the capacitors of the bits from the bit (the $(i-2)^{th}$ bit) after the next lower bit of the target bit to the least significant bit using the differential analog-to-digital conversion.

$$e_{i,0}=\Sigma_{i-2}^{0}(2*b_{k-1}-1)*\omega_k/2 \quad (2)$$

In sub-step S114: a negative capacitor of the target bit in the negative capacitor array is initialized, and sampling is performed.

In sub-step S114, a lower plate of a positive capacitor Ci-1_p of the lower bit next to the target bit in the positive capacitor array 211 is connected to the positive reference voltage VRP. Lower plates of other positive capacitors in the positive capacitor array 211 are connected to the negative reference voltage VRN. A lower plate of a negative capacitor Ci_n of the target bit in the negative capacitor array 212 is connected to the positive reference voltage VRP. Lower plates of other negative capacitors in the negative capacitor array 212 are connected to the negative reference voltage VRN. An upper plate of each positive capacitor in the positive capacitor array 211 is connected to the common voltage VCM through a single-selection switch, and an upper plate of each negative capacitor in the negative capacitor array 212 is connected to the common voltage VCM through a single-selection switch. That is, the positive output end VP, the negative output end VN and the common voltage VCM are equal (VP=VN=VCM).

Then, the aforementioned common voltage VCM is disconnected and sampling is then performed, so that the capacitive charges of the positive capacitor array 211 and the negative capacitor array 212 are kept constant.

With reference to FIG. 6, the initialization process comprises:

Vk_p=VRN, Vk_n=VRN, Vi_p=VRN, Vi_n=VRP, Vi-1_p=VRP, Vi-1_n=VRN, VP=VN=VCM, wherein, Vk_p is the three-selection switch connected to the lower plate of the positive capacitor of the $k^{th}$ bit, Vk_n is the three-selection switch connected to the lower plate of the negative capacitor of the $k^{th}$ bit, Vi_p is the lower plate voltage of the positive capacitor of the $i^{th}$ bit, Vi_n is the lower plate voltage of the negative capacitor of the $i^{th}$ bit. Similarly, Vi-1_p and Vi-1_n are the lower plate voltage of the positive capacitor of the $(i-1)^{th}$ bit and the lower plate voltage of the negative capacitor of the $(i-1)^{th}$ bit, respectively. After initializing the capacitors and the switches, the common voltage is disconnected and sampling is performed.

In sub-step S115: plate voltage states of the capacitors of the target bit and capacitors of the lower bit next to the target bit is switched through the logic control to obtain a second weight error voltage of the capacitors of the target bit.

In sub-step S115, the logic control is used to switch the plate voltage states of the negative capacitor Ci_n of the target bit and the negative capacitor Ci-1_n of a lower bit next to the target bit, so that the lower plate of the negative capacitor Ci-1_n of the lower bit next to the target bit in the negative capacitor array 212 is switched to be connected to the positive reference voltage VRP, the lower plate of the negative capacitor Ci_n of the target bit is switched to be connected to the negative reference voltage VRN, the lower plate of the positive capacitor Ci-1_p of the lower bit next to the target bit in the positive capacitor array 211 is switched to be connected to the negative reference voltage VRN, and the second weight error voltage is generated between the positive output end VP of the positive capacitor array 211 and the negative output end VN of the negative capacitor array 212. Wherein the second weight error voltage VP−VN represents the difference between the actual weight value $\omega_{i,1}$ of the negative capacitor Ci_n of the target bit and the sum $\omega_{i-1}$ of the actual weight value of the positive capacitor Ci-1_p of the lower bit next to the target bit and the actual weight value of the negative capacitor Ci-1_n of the lower bit next to the target bit.

$$VP-VN=(VRP-VRN)*(\omega_{i,1}-\omega_{i-1})/\omega_{total} \quad (3)$$

In the embodiment, in combination with FIG. 6, specifically, switch connection states are switched through the logic control making Vi_p=VRN, Vi_n=VRN, Vi-1_p=VRN, Vi-1_n=VRP, so that the second weight error voltage VP−VN is generated between the positive output end VP of the positive capacitor array 211 and the negative output end VN of the negative capacitor array 212.

In the case of ideal matching, Ci_p=Ci_n=2*Ci-1_p=2*Ci-1_n, $\omega_{i,1}-\omega_{i-1}=0$, that is, the voltage value of the second weight error voltage VP−VN is zero. However, due to capacitor mismatch, the second weight error voltage VP−VN can also be positive or negative.

In sub-step S116: the second weight error voltage is converted by using the differential analog-to-digital conversion to obtain a second weight error voltage code of the capacitors of the target bit.

In sub-step S116, the second weight error voltage code is represented by the capacitors of the bits from a bit (the $(i-_2)^{th}$ bit) after the next lower bit of the target bit to the least significant bit. Specifically, the i−1 bit code $b_{i-2}b_{i-1} \ldots b_0$ of the second weight error voltage is obtained by converting the second weight error voltage with the capacitors of the bits from the $(i-_2)^{th}$ bit to the least significant bit using the differential analog-to-digital conversion.

$$e_{i,1}=\Sigma_{i-2}^{0}(2*b_{k-1}-1)*\omega_k/2 \quad (4)$$

In sub-step S117: the error code between the actual weight value and the ideal weight value of the capacitors of the target bit is obtained according to the first weight error voltage code and the second weight error voltage code.

In sub-step S117, the weight $\omega_i$ and the weight error $e_i$ of the $i^{th}$ bit can be obtained according to the aforementioned first weight error voltage code and the second weight error voltage code:

$$\omega_i-2*\omega_{i-1}=e_{i,0}-e_{i,1} \quad (5)$$

$$\omega_i=2*\omega_{i-1}+e_{i,0}-e_{i,1} \quad (6)$$

$$e_i=2*\omega_{i-1}+e_{i,0}-e_{i,1} \quad (7)$$

By using the calibration method proposed in the embodiments of the present disclosure, the weight error $e_i$ from the $(m+1)^{th}$ bit to the $(n-1)^{th}$ bit can be obtained, and then after the normal conversion, by performing simple addition and/or subtraction based on the binary output code $code_{ideal}$ of the analog-to-digital converter which is initially obtained to be calibrated, the correct code $code_{correct}$ is obtained. That is, the calibrated output code is:

$$code_{correct}=code_{ideal}+\Sigma_{i=m+1}^{n-1}e_i \quad (8)$$

In another embodiment provided by the present disclosure, the above steps in the calibration method are basically the same as those in the previous embodiment, and then after the weight $\omega_i$ of the $i^{th}$ bit is obtained based on the formula (6) in sub-step S117, the correct code $code_{correct}$ can be obtained by performing simple addition and subtraction based on the binary output code $code_{ideal}$ of the analog-to-digital converter which is initially obtained to be calibrated and by use of the weight $\omega_i$ of the $i^{th}$ bit, that is, the calibrated output code is:

$$code_{correct}=\Sigma_{i=0}^{n-1}(2*b_i-1)*\omega_i \quad (9)$$

Wherein, $b_i$ is the binary code value of the $i^{th}$ bit in the corresponding output code $code_{ideal}$.

In a practical application, the calibration method described in any one of the above two embodiments can be selected in combination with the actual application scenario to obtain the calibrated output code.

The calibration method proposed in any one of the above two embodiments can also comprise:

selecting an appropriate unit capacitor C to ensure that the weight errors of capacitors of the bits from the least significant bit (LSB) to a next bit (the $m^{th}$ bit) of the lowest target bit (the $(m+1)^{th}$ bit) to be calibrated in the successive approximation register analog-to-digital converter 200 are very small, so as to obtain the calibrated output code from the $(m+1)^{th}$ bit to the $(n-1)^{th}$ bit (the most significant bit, MSB). The bit order of the lowest target bit (the $(m+1)^{th}$ bit) to be calibrated mentioned above is lower than the bit order of the most significant bit (the $(n-1)^{th}$ bit) which is capable to be converted by the successive approximation register analog-to-digital converter 200, that is, m is far less than n−1.

Therefore, the calibration method proposed in the embodiments of the present disclosure can realize the bit-by-bit calibration from the $(m+1)^{th}$ bit to the $(n-1)^{th}$ bit using the steps mentioned above, so as to obtain all weights and weight errors, which effectively avoids the problem that the existence of comparator voltage offset makes the DNL drifting in a certain direction and further makes several calibration bits of the LSB insufficient to represent the error value including the voltage offset, thus improving the calibration precision and accuracy.

When the calibration method proposed in the embodiments of the present disclosure is applied to a single-ended input analog-to-digital converter or an analog-to-digital converter with differential input of a traditional binary capacitor array or bridge capacitor array, the weight deviation caused by capacitor mismatch or parasitic capacitor can be calibrated by achieving the weight of each bit through a single capacitor or a pair of equivalent capacitors.

The calibration method breaks through the requirement that non-binary weights must meet redundancy, and can realize a weight calibration in a traditional binary analog-to-digital converter and a digital calibration by performing simple addition and subtraction on the basis of the original code obtained by using an analog-to-digital conversion, thus effectively reducing the circuit complexity and calculation complexity caused by non-binary weighting.

Optionally, in an embodiment, the aforementioned step of obtaining the actual weight value of the capacitors of the target bit and the error code between the actual weight value and the ideal weight value of the capacitors of the target bit can also include:
  repeating an acquisition step to obtain a plurality of first weight error voltages, a plurality of first weight error voltage codes, a plurality of second weight error voltages and a plurality of second weight error voltage codes;
  calculating an average value of the plurality of first weight error voltage codes and an average value of the plurality of second weight error voltage codes respectively;
  obtaining the error code between the actual weight value and the ideal weight value of the capacitors of the target bit according to the average value of the plurality of first weight error voltage codes and the average value of the plurality of second weight error voltage codes.

In another embodiment, the aforementioned step of obtaining the actual weight value of the capacitors of the target bit and the error code between the actual weight value and the ideal weight value of the capacitors of the target bit can also include:
  repeating the acquisition step to obtain the plurality of first weight error voltage codes and the plurality of second weight error voltage codes;
  calculating a plurality of error codes between the actual weight value and the ideal weight value of the capacitors of the target bit;
  obtaining a final error code by calculating an average value of the plurality of error codes.

The above two embodiments can effectively eliminate the interference of noise by repeatedly obtaining the average value to further improve the calibration precision and accuracy.

In some embodiments, an appropriate capacitor size can be selected to meet lower bits matching requirement according to capacitor production process, and then an analog-to-digital conversion of the SAR ADC itself can be used to calibrate the weights of different high bits selected accordingly to obtain the accurate bit weights, thereby improving the calibration efficiency.

Optionally, the aforementioned calibration method can also include:
  adjusting a bit width of the output code obtained after each calibration according to a preset accuracy requirement and/or a parameter of a static memory to further improve the weight calibration precision and accuracy, wherein the static memory (SRAM) is used to store the actual weight value.

It should be noted that in the description of the present disclosure, it should be understood that the terms indicating orientations or positional relationships including "up", "down", "inside" and so on, are only used to facilitate the description of the present disclosure and simplify the description, rather than to indicate or imply that the components or elements referred must have a specific orientation, or be constructed and operated in a specific orientation, and therefore the terms cannot be understood as limits to the present disclosure.

In addition, in the present disclosure, the terms "include", "comprise" or its any other variant are intended to cover non-exclusive inclusion, so that a process, method, article or device including a series of elements not only includes those elements, but also includes other elements not explicitly listed, or also includes elements inherent to such process, method, article or device. Without further restrictions, the elements defined by the statement "including a . . . " do not exclude that there are other identical elements in the process, method, article or device including the elements.

Finally, it should be noted that, obviously, the above embodiments are only examples to clearly illustrate the present disclosure, rather than limits to the embodiments. For ordinary technicians in the art, other changes or modifications in different forms can be made on the basis of the above description. It is unnecessary and impossible to enumerate all embodiments here. The obvious changes or modifications arising therefrom are still within the protection scope of the present disclosure.

What is claimed is:

1. A calibration method of a capacitor array type successive approximation register analog-to-digital converter comprising capacitors, wherein the capacitors of bits from low to high in the successive approximation register analog-to-digital converter are arranged with binary weight proportions, and the calibration method comprises:
  obtaining an actual weight value of capacitors of a target bit and an error code between the actual weight value and an ideal weight value of the capacitors of the target bit;
  calibrating an output code of the successive approximation register analog-to-digital converter to be calibrated with the error code by performing corresponding addition or subtraction to obtain a final calibrated output code,
  wherein a capacitor array of the successive approximation register analog-to-digital converter comprises a positive capacitor array and a negative capacitor array, the step of obtaining the actual weight value of the capacitors of the target bit and the error code between the actual weight value and the ideal weight value of the capacitors of the target bit comprises:

initializing a positive capacitor of the target bit in the positive capacitor array and sampling;

switching plate voltage states of the capacitors of the target bit and capacitors of the lower bit next to the target bit through a logic control to obtain a first weight error voltage of the capacitors of the target bit;

converting the first weight error voltage using a differential analog-to-digital conversion to obtain a first weight error voltage code of the capacitors of the target bit, wherein the first weight error voltage code is represented by capacitors of bits from the bit next to the next lower bit of the target bit to the least significant bit;

initializing a negative capacitor of the target bit in the negative capacitor array and sampling;

switching plate voltage states of the capacitors of the target bit and capacitors of the lower bit next to the target bit through the logic control to obtain a second weight error voltage of the capacitors of the target bit;

converting the second weight error voltage using the differential analog-to-digital conversion to obtain a second weight error voltage code of the capacitors of the target bit, wherein the second weight error voltage code is represented by the capacitors of the bits from the bit next to the next lower bit of the target bit to the least significant bit;

obtaining the error code between the actual weight value and the ideal weight value of the capacitors of the target bit according to the first weight error voltage code and the second weight error voltage code, wherein the capacitors of the target bit comprise the positive capacitor of the target bit and the negative capacitor of the target bit.

2. The calibration method according to claim 1, wherein each positive capacitor of any bit has a lower plate connected to any one of a positive input voltage, a positive reference voltage and a negative reference voltage through a three-selection switch, and an upper plate connected with a positive output end of the positive capacitor array at a connection node which is connected to a common voltage through a single-selection switch, and the step of initializing the positive capacitor of the target bit in the positive capacitor array and sampling comprises:

connecting a lower plate of the positive capacitor of the target bit in the positive capacitor array to the positive reference voltage, connecting lower plates of other positive capacitors in the positive capacitor array to the negative reference voltage, connecting a lower plate of a negative capacitor of the lower bit next to the target bit in the negative capacitor array to the positive reference voltage, connecting lower plates of other negative capacitors in the negative capacitor array to the negative reference voltage, and connecting an upper plate of each positive capacitor in the positive capacitor array to the common voltage through a single-selection switch, connecting an upper plate of each negative capacitor in the negative capacitor array to the common voltage through a single-selection switch;

disconnecting the common voltage from the upper plate of each positive capacitor and the upper plate of each negative capacitor and performing sampling, so as to keep capacitive charges of the positive capacitor array and the negative capacitor array constant.

3. The calibration method according to claim 2, wherein the step of switching the plate voltage states of the capacitors of the target bit and the capacitors of the lower bit next to the target bit through the logic control to obtain the first weight error voltage of the capacitors of the target bit comprises:

switching the plate voltage states of the positive capacitor of the target bit and a positive capacitor of the lower bit next to the target bit through the logic control, so as to switch the lower plate of the positive capacitor of the target bit in the positive capacitor array to be connected to the negative reference voltage, a lower plate of the positive capacitor of the lower bit next to the target bit to be connected to the positive reference voltage, and switching a lower plate of the negative capacitor of the lower bit next to the target bit in the negative capacitor array to be connected to the negative reference voltage, wherein the first weight error voltage is generated between the positive output end of the positive capacitor array and a negative output end of the negative capacitor array, wherein the first weight error voltage represents a difference between an actual weight value of the positive capacitor of the target bit and a sum of an actual weight value of the positive capacitor of the lower bit next to the target bit and an actual weight value of the negative capacitor of the lower bit next to the target bit.

4. The calibration method according to claim 3, wherein each negative capacitor of any bit has a lower plate connected to any one of a negative input voltage, the positive reference voltage and the negative reference voltage through a three-selection switch, and an upper plate connected with the negative output end of the negative capacitor array at a connection node which is connected to the common voltage through a single-selection switch, and the step of initializing the negative capacitor of the target bit in the negative capacitor array and sampling comprises:

connecting the lower plate of the positive capacitor of the lower bit next to the target bit in the positive capacitor array to the positive reference voltage;

connecting lower plates of other positive capacitors in the positive capacitor array to the negative reference voltage;

connecting the lower plate of the negative capacitor of the target bit in the negative capacitor array to the positive reference voltage;

connecting lower plates of other negative capacitors in the negative capacitor array to the negative reference voltage;

connecting the upper plate of each positive capacitor in the positive capacitor array to the common voltage through a single-selection switch;

connecting the upper plate of each negative capacitor in the negative capacitor array to the common voltage through a single-selection switch;

disconnecting the common voltage from the upper plate of each positive capacitor and the upper plate of each negative capacitor and performing sampling, so as to keep the capacitive charges of the positive capacitor array and the negative capacitor array constant.

5. The calibration method according to claim 4, wherein the step of switching the plate voltage states of the capacitors of the target bit and the capacitors of the lower bit next to the target bit through the logic control to obtain the second weight error voltage of the capacitors of the target bit comprises:

switching the plate voltage states of the positive capacitors of the target bit and the lower bit next to the target bit through the logic control, so as to switch the lower plate of the positive capacitor of the lower bit next to the target bit in the positive capacitor array to be connected to the negative reference voltage, and switching the lower plate of the negative capacitor of the lower bit next to the target bit in the negative capacitor array to be connected to the positive reference voltage, and the lower plate of the negative capacitor of the target bit to be connected to the negative reference voltage, wherein the second weight error voltage is generated between the positive output end of the positive capacitor array and the negative output end of the negative capacitor array, the second weight error voltage represents a difference between an actual weight value of the negative capacitor of the target bit and the sum of the actual weight value of the positive capacitor of the lower bit next to the target bit and the actual weight value of the negative capacitor of the lower bit next to the target bit.

6. The calibration method according to claim 5, wherein the step of obtaining the actual weight value of the capacitors of the target bit and the error code between the actual weight value and the ideal weight value of the capacitors of the target bit further comprises:

repeating an acquisition step to obtain a plurality of first weight error voltages, a plurality of first weight error voltage codes, a plurality of second weight error voltages and a plurality of second weight error voltage codes;

calculating an average value of the plurality of first weight error voltage codes and an average value of the plurality of second weight error voltage codes respectively; and obtaining the error code between the actual weight value and the ideal weight value of the capacitors of the target bit according to the average value of the plurality of first weight error voltage codes and the average value of the plurality of second weight error voltage codes;

or repeating the acquisition step to obtain the plurality of first weight error voltage codes and the plurality of second weight error voltage codes;

calculating a plurality of error codes between the actual weight value and the ideal weight value of the capacitors of the target bit;

obtaining a final error code by calculating an average value of the plurality of error codes.

7. The calibration method according to claim 1, wherein the calibration method further comprises:

selecting an appropriate capacitor size to meet lower bits matching requirement according to capacitor production process, so that the weights of different starting high bits can be selected and calibrated accordingly.

8. The calibration method according to claim 1, wherein the calibration method further comprises:

adjusting a bit width of the output code obtained after each calibration according to a preset accuracy requirement and/or a parameter of a static memory, which is used to store the actual weight value or the error code.

9. A calibration method of a capacitor array type successive approximation register analog-to-digital converter comprising capacitors, wherein the capacitors of bits from low to high in the successive approximation register analog-to-digital converter are arranged with binary weight proportions, and the calibration method comprises:

obtaining an actual weight value of capacitors of a target bit and a binary code of the actual weight value;

calibrating an output code of the successive approximation register analog-to-digital converter to be calibrated with the binary code by performing corresponding addition or subtraction to obtain a final calibrated output code, wherein a capacitor array of the successive approximation register analog-to-digital converter comprises a positive capacitor array and a negative capacitor array, the step of obtaining the actual weight value of the capacitors of the target bit and the binary code of the actual weight value comprises:

initializing a positive capacitor of the target bit in the positive capacitor array and sampling;

switching plate voltage states of the capacitors of the target bit and capacitors of the lower bit next to the target bit through a logic control to obtain a first weight error voltage of the capacitors of the target bit;

converting the first weight error voltage using a differential analog-to-digital conversion to obtain a first weight error voltage code of the capacitors of the target bit, wherein the first weight error voltage code is represented by capacitors of bits from the bit next to the next lower bit of the target bit to the least significant bit;

initializing a negative capacitor of the target bit in the negative capacitor array and sampling;

switching plate voltage states of the capacitors of the target bit and capacitors of the lower bit next to the target bit through the logic control to obtain a second weight error voltage of the capacitors of the target bit;

converting the second weight error voltage using the differential analog-to-digital conversion to obtain a second weight error voltage code of the capacitors of the target bit, wherein the second weight error voltage code is represented by the capacitors of the bits from the bit next to the next lower bit of the target bit to the least significant bit;

obtaining the binary code of the actual weight value of the capacitors of the target bit according to the first weight error voltage code and the second weight error voltage code, wherein the capacitors of the target bit comprise the positive capacitor of the target bit and the negative capacitor of the target bit.

* * * * *